United States Patent
Wolkovitz et al.

(10) Patent No.: US 11,190,191 B2
(45) Date of Patent: Nov. 30, 2021

(54) CORRECTION SIGNALING BETWEEN LANES IN MULTI-CHIP-MODULES

(71) Applicant: MELLANOX TECHNOLOGIES, LTD., Yokneam (IL)

(72) Inventors: Omer Wolkovitz, Haifa (IL); Eilon Yanai, Haifa (IL)

(73) Assignee: MELLANOX TECHNOLOGIES, LTD., Yokneam (IL)

(*) Notice: Subject to any disclaimer, the term of this patent is extended or adjusted under 35 U.S.C. 154(b) by 0 days.

(21) Appl. No.: 17/246,725

(22) Filed: May 3, 2021

(65) Prior Publication Data

US 2021/0297082 A1 Sep. 23, 2021

Related U.S. Application Data

(63) Continuation of application No. 16/823,577, filed on Mar. 19, 2020, now Pat. No. 11,031,939.

(51) Int. Cl.
*H03L 7/08* (2006.01)
*H03L 7/091* (2006.01)

(52) U.S. Cl.
CPC .......... *H03L 7/0807* (2013.01); *H03L 7/0802* (2013.01); *H03L 7/091* (2013.01)

(58) Field of Classification Search
CPC ..... H03L 7/00; H03L 7/06; H03L 7/08; H03L 7/081; H03L 7/085; H03L 7/0812; H03L 7/0802; H03L 7/0807; H03L 7/091
See application file for complete search history.

(56) References Cited

U.S. PATENT DOCUMENTS 6,393,599 B1* 5/2002 Chan ............... H04L 27/233
714/797
6,509,773 B2* 1/2003 Buchwald ......... H03L 7/0816
327/248

(Continued)

FOREIGN PATENT DOCUMENTS

EP 1067742 A2 1/2001
EP 3043477 A2 7/2016

(Continued)

OTHER PUBLICATIONS

Sonntag et al., "A Digital Clock and Data Recovery Architecture for Multi-Gigabit/s Binary Links", IEEE Journal of Solid-State Circuits, vol. 41, No. 8, pp. 1867-1875, Aug. 2006.

(Continued)

*Primary Examiner* — James M Perez
(74) *Attorney, Agent, or Firm* — Kligler & Associates Patent Attorneys Ltd

(57) ABSTRACT

A Multi-Chip-Module (MCM) includes an MCM substrate, and at least a data producing IC (DPIC) and a data-consuming IC (DCIC), both mounted on the MCM substrate and connected to one another through a high-speed bus including at least first and second embedded-clock data lanes. The DCIC includes a clock-data recovery circuit (CDR) and a data sampler. The CDR is configured to restore a data and a clock from the first data lane, and to output phase correction signaling. The data sampler is configured to restore the data from the second data lane by sampling the second data lane at a phase responsive to the phase correction signaling derived from the first data lane.

12 Claims, 4 Drawing Sheets

(56) References Cited

U.S. PATENT DOCUMENTS

| | | | | |
|---|---|---|---|---|
| 6,775,328 B1* | 8/2004 | Segaram | | H04L 7/0337 375/219 |
| 7,139,348 B1* | 11/2006 | Fu | | H03L 7/07 375/376 |
| 7,587,012 B2* | 9/2009 | Evans | | H03L 7/07 375/354 |
| 7,606,341 B2* | 10/2009 | Pereira | | H04L 7/0337 375/224 |
| 7,684,534 B2* | 3/2010 | Buchmann | | H04L 7/0083 375/376 |
| 7,743,168 B2* | 6/2010 | Tang | | H04J 3/047 709/248 |
| 8,050,373 B2* | 11/2011 | Buchwald | | H04L 25/20 375/356 |
| 8,149,979 B2* | 4/2012 | Buchmann | | H04L 7/005 375/371 |
| 9,184,909 B1* | 11/2015 | McCracken | | H04L 7/002 |
| 9,362,928 B1* | 6/2016 | Goyal | | H03L 7/081 |
| 9,374,250 B1* | 6/2016 | Musah | | H04L 25/14 |
| 9,432,176 B2* | 8/2016 | Yu | | H03L 7/091 |
| 9,496,879 B1* | 11/2016 | Duan | | H03L 7/0807 |
| 9,520,988 B1* | 12/2016 | Wiley | | H04L 25/4923 |
| 9,565,036 B2* | 2/2017 | Zerbe | | G06F 1/10 |
| 9,577,816 B2* | 2/2017 | Hossain | | H03L 7/1974 |
| 9,645,965 B2* | 5/2017 | Das Sharma | | H04L 25/0272 |
| 9,680,666 B2* | 6/2017 | Wiley | | H04L 5/20 |
| 9,813,269 B1* | 11/2017 | Yoon | | H04B 1/40 |
| 9,819,523 B2* | 11/2017 | Lee | | H04L 25/4917 |
| 9,832,006 B1* | 11/2017 | Bandi | | H04L 7/0008 |
| 9,906,285 B2* | 2/2018 | Ling | | H04B 7/0617 |
| 10,148,258 B2* | 12/2018 | Carlson | | G06F 1/3206 |
| 10,187,094 B1* | 1/2019 | Nedovic | | H04B 1/16 |
| 10,320,534 B2* | 6/2019 | Chandrasekaran | ... | H04L 7/0083 |
| 10,326,625 B1* | 6/2019 | Nedovic | | H04L 25/06 |
| 10,419,200 B2* | 9/2019 | Takahashi | | H04L 7/0029 |
| 10,735,010 B1* | 8/2020 | Faig | | H03M 1/0624 |
| 10,778,406 B2* | 9/2020 | Gaist | | H04J 3/0697 |
| 10,848,298 B1* | 11/2020 | Mohr | | H04L 7/0334 |
| 10,887,077 B1* | 1/2021 | Ivry | | H04L 25/4917 |
| 11,031,939 B1* | 6/2021 | Wolkovitz | | H03L 7/0802 |
| 11,070,224 B1* | 7/2021 | Faig | | H03M 1/0626 |
| 11,108,536 B1* | 8/2021 | Faig | | H04L 7/0331 |
| 2004/0208270 A1* | 10/2004 | Schmatz | | H03L 7/091 375/355 |
| 2005/0111585 A1* | 5/2005 | Stojanovic | | H04L 25/063 375/316 |
| 2006/0071691 A1* | 4/2006 | Garlepp | | H03K 19/1774 326/93 |
| 2006/0224339 A1* | 10/2006 | Kim | | H03L 7/0814 702/66 |
| 2009/0290672 A1* | 11/2009 | Ho | | H03L 7/113 375/374 |
| 2011/0208990 A1* | 8/2011 | Zerbe | | G06F 1/08 713/501 |
| 2011/0249718 A1* | 10/2011 | Zerbe | | H03L 7/07 375/226 |
| 2011/0305271 A1* | 12/2011 | Zerbe | | H04L 25/03057 375/232 |
| 2013/0083611 A1* | 4/2013 | Ware | | G06F 3/0673 365/191 |
| 2013/0262909 A1* | 10/2013 | Yang | | H04L 7/033 713/501 |
| 2013/0294490 A1* | 11/2013 | Chandrasekaran | ..... | H04L 1/205 375/226 |
| 2014/0093245 A1* | 4/2014 | Kim | | H04B 10/40 398/82 |
| 2014/0140439 A1* | 5/2014 | Agrawal | | H04L 25/14 375/316 |
| 2015/0078495 A1* | 3/2015 | Hossain | | H04L 27/0014 375/346 |
| 2015/0220472 A1* | 8/2015 | Sengoku | | G06F 13/4068 375/340 |
| 2016/0182259 A1* | 6/2016 | Musah | | H04L 7/0058 375/233 |
| 2016/0308540 A1* | 10/2016 | Subramanian | | G06F 1/10 |
| 2017/0017587 A1* | 1/2017 | West | | G11C 7/222 |
| 2018/0183633 A1* | 6/2018 | Ho | | H04L 7/033 |
| 2019/0305926 A1* | 10/2019 | Li | | G06F 13/4282 |
| 2019/0385057 A1* | 12/2019 | Litichever | | G06N 3/08 |
| 2020/0252072 A1* | 8/2020 | Wu | | G11C 29/023 |
| 2020/0365199 A1* | 11/2020 | Seong | | G11C 11/4076 |
| 2021/0297082 A1* | 9/2021 | Wolkovitz | | H03L 7/00 |

FOREIGN PATENT DOCUMENTS

| | | |
|---|---|---|
| WO | 2012038546 A1 | 3/2012 |
| WO | 2015120149 A1 | 8/2015 |

OTHER PUBLICATIONS

Jadid et al., "Parallel Ultra-Short Reach Die-to-Die Links", PhD Thesis, Graduate Department of Electrical and Computer Engineering, University of Toronto, pp. 1-141, 2017.

* cited by examiner

CORRECTION SIGNALING BETWEEN LANES IN MULTI-CHIP-MODULES

FIELD OF THE INVENTION

The present invention relates generally to Clock and Data Recovery (CDR), and particularly to efficient CDR implementation in Multi-Chip-Modules (MCMs).

BACKGROUND OF THE INVENTION

Communication between Integrated Circuits (ICs) in a Multi-Chip-Module (MCM) is typically done at high bit rates over a plurality of short point-to-point wires (Ultra-Short-Reach, or USR). The USR wires often carry serialized data in a plurality of lanes, using high speed SERDES techniques. In some applications, the clock signal is not sent, and the receiving integrated circuits employ Clock-Data Recovery (CDR) techniques to recover the clock from the data.

In "A Digital Clock and Data Recovery Architecture for Multi-Gigabit/s Binary Links," Sonntag and Stonick, IEEE Journal of Solid-State Circuits, Vol. 41, No. 8, August, 2006, the authors describe a general architecture for digital clock and data recovery (CDR) for high-speed binary links, based on replacing elements of typical analog CDRs with digital components.

In "Parallel Ultra-Short Reach Die-to-Die Links," PhD Thesis, Graduate Department of Electrical and Computer Engineering, University of Toronto, 2017, Behzad Dehlaghi Jadid describes the challenges and the techniques that are typically used in USR communications.

Lastly, U.S. Pat. No. 8,149,979 describes multilane SERDES communication, wherein a clock lane and a plurality of data lanes are sent from a transmitter to a receiver, which extracts the input clock using CDR circuits and locks an internal clock to the extracted receive clock.

SUMMARY OF THE INVENTION

An embodiment of the present invention that is described herein provides a Multi-Chip-Module (MCM) including an MCM substrate, and at least a data producing IC (DPIC) and a data-consuming IC (DCIC), both mounted on the MCM substrate and connected to one another through a high-speed bus including at least first and second embedded-clock data lanes. The DCIC includes a clock-data recovery circuit (CDR) and a data sampler. The CDR is configured to restore a data and a clock from the first data lane, and to output phase correction signaling. The data sampler is configured to restore the data from the second data lane by sampling the second data lane at a phase responsive to the phase correction signaling derived from the first data lane.

In some embodiments, the phase correction signaling includes a phase-increment and a phase-decrement signals. In an embodiment, the data sampler includes a phase-shifter and a sample-and-hold, the phase-shifter configured, in response to the phase correction signaling, to send phase signaling to the sample-and-hold, and the sample-and-hold configured to sample the second data lane in response to the phase signaling.

In some embodiments, the CDR and the sampler include respective first and second instances of a circuit that is configurable to operate in first and second configurations, such that, in the first configuration, the circuit is configured to restore the data and the clock from a data lane, and in the second configuration, the circuit is configured to receive the phase correction signaling from a peer circuit and to restore the data from the data lane based on the phase correction signaling received from the peer circuit. In an example embodiment, in the second configuration, the circuit is further configured to transfer the phase control signaling to an additional peer circuit. In an embodiment, the circuit includes clock recovery circuitry that is enabled in the first configuration and disabled in the second configuration. In an embodiment, the circuit is configured to acquire an initial clock phase of the data lane in the first configuration, and then to switch to the second configuration and track clock-phase variations, relative to the peer circuit, based on the received phase correction signaling.

There is additionally provided, in accordance with an embodiment of the present invention, a method in a Multi-Chip-Module (MCM). The method includes communicating in the MCM between a data producing IC (DPIC) and a data-consuming IC (DCIC), both mounted on the MCM substrate and connected to one another through a high-speed bus comprising at least first and second embedded-clock data lanes. A data and a clock are restored from the first data lane in the DCIC using a clock-data recovery circuit (CDR), so as to output phase correction signaling. The data is restored from the second data lane in the DCIC using a data sampler, by sampling the second data lane at a phase responsive to the phase correction signaling derived from the first data lane.

The present invention will be more fully understood from the following detailed description of the embodiments thereof, taken together with the drawings in which:

DETAILED DESCRIPTION OF EMBODIMENTS

Overview

Figure 1:
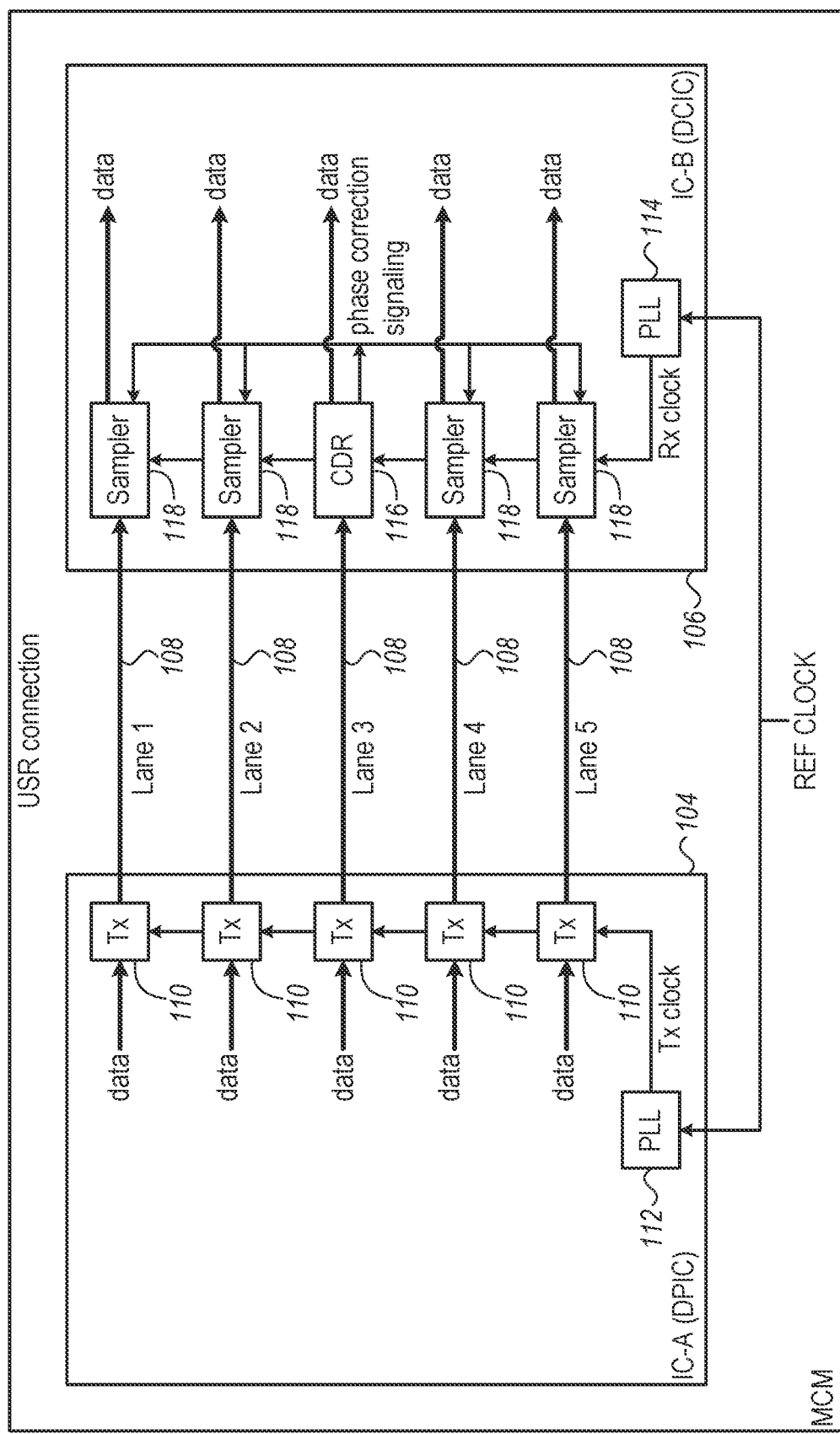
FIG. 1 is a block diagram that schematically illustrates Ultra-Short-Reach (USR) communication between two integrated circuits in a Multi-Chip-Module (MCM), in accordance with embodiments of the present invention.

The term multi-chip module (MCM) usually refers to an electronic assembly comprising multiple integrated circuits (ICs) and/or discrete components that are integrated in a single device package, typically on a common substrate. Communication between the ICs of an MCM is done over short distances and is sometimes referred to as Ultra-Short-Reach (USR) communication. We will sometimes refer to the USR also as high-speed bus.

In high-performance MCMs, such as those used in network elements, communication between the ICs of the MCM may be fast and is often carried out by dedicated Serializer/Deserializer (SERDES) circuits that are coupled to physical-layer (PHY) units and transfer high speed data over dedicated USR point-to-point wires. We will refer hereinbelow to the IC that transmits the data as Data Producing IC (DPIC), and to the IC that receives the data over the dedicated USR wires as Data Consuming IC (DCIC).

The high speed data transmission medium may comprise a plurality of Lanes, each lane typically comprising a balanced differential pair of wires that transmits symbols serially. The reference clock may be transmitted in a separate lane or, alternatively, may not be sent.

Conventionally, Clock-Data-Recovery (CDR) circuits may be used at the DCIC to restore the data and the clock from each lane. A CDR phase-aligns a reference clock to the transitions on the incoming data stream ("clock recovery"), and then samples the incoming data signal with the recovered clock or with a shifted version thereof ("data recovery").

Phase-alignment (also called "locking") circuits, however, are relatively complex and power-consuming. When multiple lanes are implemented, the additional power and area that is added to the DCIC may be significant.

Embodiments of the present invention that are disclosed herein provide apparatuses and methods for power and area efficient clock and data recovery in multiple-lane USR communication in DCIC integrated circuits of an MCM.

In some embodiments, the lanes that are input to a DCIC are short and well matched in terms of delay and/or interference; as a result, the phase differences between the lanes are small, and, in some cases, inter-lane phase differences may be ignored. In other embodiments, the phase differences may be substantial, but variation in phase differences over time may be ignored; the variation of the phase difference from the initial phase will be referred to as "phase variation".

In an embodiment, the difference between the phase variations of neighboring lanes are small enough to be ignored. The DCIC comprises, for some of the lanes, sampling units (also referred to as "samplers") rather than full CDRs. The sampling units are configured to receive phase correction signaling, e.g., phase increment and phase decrement signals, from neighboring CDRs and change the sampling phase accordingly. Thus, considerable saving in area and power are achieved.

In some embodiments, an initial phase is determined, separately for lane, e.g., during reset (methods to determine the initial phase will be disclosed hereinbelow). After reset, the samplers receive phase correction signals and follow the phase correction of neighboring CDRs.

In an embodiment, area saving is sacrificed and identical CDR units are used. However, the CDRs can be configured, e.g., by software, strap-pin or mask-options, to function as samplers that receive phase correction signaling from neighboring CDRs and modify the sampling phase accordingly (and, optionally, propagate the phase correction signaling to further neighboring CDRs that are configured to function as samplers). Thus, in this embodiment, all CDRs are identical having closely matched delays and induced noise; area is not saved, but the power consumption is significantly reduced.

System Description

FIG. 1 is a block diagram that schematically illustrates Ultra-Short-Reach (USR) communication between two integrated circuits in a Multi-Chip-Module (MCM) 102, in accordance with embodiments of the present invention. The MCM comprises a first Integrated Circuit (IC-A) 104, which sends data to a second Integrated Circuit (IC-B) 106, over an Ultra-Short-Range (USR) connection, comprising Lanes 108, which are marked Lane 1 through Lane 5.

In practice, the MCM may comprise other integrated circuits and/or discrete components, which are typically assembled on a common substrate; such elements are not shown in FIG. 1, for clarity. Moreover, both IC-A 104 and IC-B 106 may be coupled to other ICs (or to each other) by additional connections that are not shown, USR or others, and transfer data in any direction. Thus, FIG. 1 illustrates solely a data path within MCM 102, wherein IC-A serves as a Data-Producing IC (DPIC) and IC-B serves as a Data-Consuming IC (DCIC). In the description below we will sometimes refer to IC-A and IC-B as DPIC and DCIC, respectively.

DCIC 104 comprises Tx circuits 110 and a Phase-Locked-Loop (PLL) 112, which generates a Transmit Clock by multiplying an input Reference Clock by a pre-programmed fraction or integer (the multiplication is typically indirect—a PLL typically divides the frequency of the transmit clock, compares the result to a division of the reference clock, and adjusts the transmit frequency accordingly, to minimize the difference between the divided frequencies; thus the reference clock frequency is, in effect, multiplied).

Each Tx circuit 110 encodes a respective data stream and transmits the encoded data on a respective data lane 108 (using, for example, Pulse-Amplitude-Modulation (PAM) 4 and 64/66 encoding). The Transmit Clock is embedded in the data lanes.

The DCIC comprises a PLL 114, which generates a Receive-Clock by multiplying an input Reference Clock by a pre-programmed fraction. In an embodiment, the same reference clock is input to both PLL 112 and PLL 114, which are preprogrammed with the same fraction; consequently, DCIC Rx clock and DTIC Tx clock will have, devoid of noise, the same frequency.

DCIC 106 further comprises a Clock-Data-Recovery circuit (CDR) 116 that is coupled to Lane 3, and Samplers 118, which are coupled to Lanes 1,2,4 and 5.

CDR 116 is configured to restore the embedded clock and to sample the data from Lane 3. The CDR is further configured to output phase correction signaling, which indicates phase corrections to the Receiver Clock that are needed to properly sample the data.

As the USR lanes are short, the phase difference between the lanes over time may be small; after the initial phases are determined, and all five lanes may be sampled with the shift relative to the initial phases. Hence, data lanes 1,2,4 and 5 are coupled to samplers rather than to CDRs. After determining the initial phases of each sampler, the samplers receive the phase correction signaling from the CDR, and sample data from the respective lanes.

Thus, according to the example embodiment illustrated in FIG. 1, restoration of clock and data from a group of USR lanes is done efficiently in terms of area and power—a single CDR circuit is implemented on one of the lanes, and the other lanes are coupled to simpler samplers that sample data at a phase which is corrected by the single CDR.

As would be appreciated, the structures of MCM 102, DPIC 104 and DCIC 106 described above are cited by way of example. MCMs, DPICs and DCICs in accordance with the disclosed techniques are not limited to the description hereinabove. For example, the number of lanes may be different from five. The CDR may be coupled to any lane (a lane that is geometrically close to the center may be preferable, although not mandatorily, as its phase shift variations may be closer to the average variation). In some embodiments more than one CDR may be used; for example, each group of three adjacent lanes may have a CDR and two samplers that are phase-controlled by the CDR.

Figure 2:
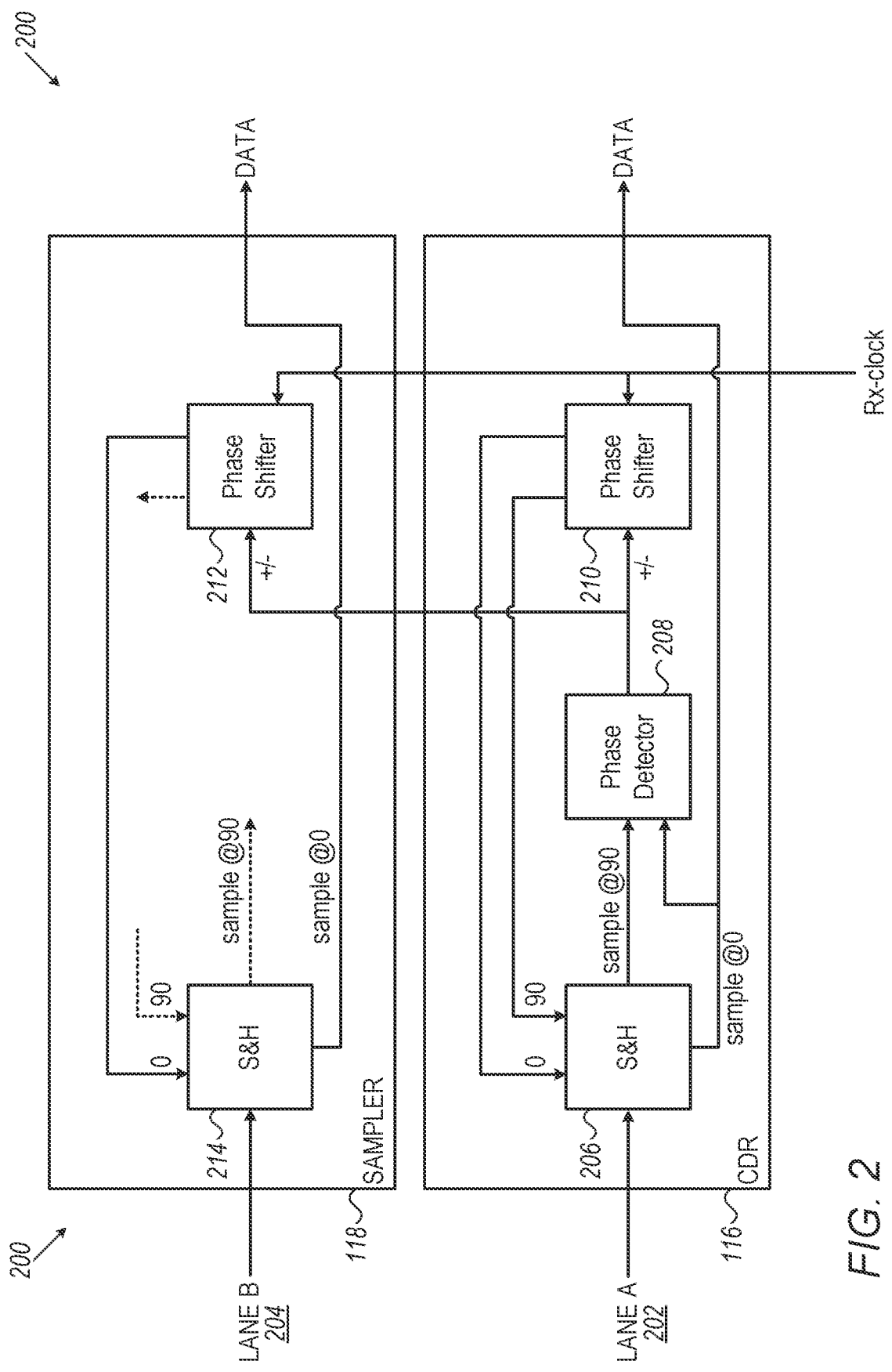
FIG. 2 is a block diagram that schematically illustrates clock and data restoration from two data lanes in a Data Consuming Integrated Circuit (DCIC), in accordance with embodiments of the present invention

FIG. 2 is a block diagram 200 that schematically illustrates clock and data restoration from two data lanes in a Data Consuming Integrated Circuit (DCIC), in accordance with embodiments of the present invention. This figure shows CDR 116 and one of samplers 118 of FIG. 1 in greater detail.

A Lane A 202 is coupled to a CDR 116 and a Lane B 204, which closely matches the interferences of Lane A, is coupled to a Sampler 118. CDR 116 comprises a Sample-and-Hold (S&H) circuit 206, a Phase Detector 208 and a Phase-Shifter 210. S&H 206 is configured to sample the incident lane in response to transitions in a "0" signal and a "90" signal, that are input from Phase Shifter 210. The two sampling points correspond to phases of a Receive Clock (Rx-clock) of the DCIC. In single-data-rate transmission (SDR) (sometimes referred to as "half rate"), sampling is done at the positive edges of the signals, e.g., at a phase shift of 0° for the "0" signal and 90° for the "90" signal, relative to the Rx-Clock; in Dual-Data-Rate (DDR) (sometimes referred to as "full rate"), sampling is done at both edges of signals; e.g., at phase shifts of 0° and 180° for the "0" signal, and at phase shifts of 90° and 270° for the "90" signal.

The signal (designated "sample @90") that the S&H samples in response to a transition on the "90" input is input to Phase Detector 208, which is configured to output an Increment or a Decrement command to Phase Shifter 210. In an embodiment, if the levels sampled at 90° and 0° phases are equal, the Phase Detector will generate an internal phase-Increment signal, to delay the generation of the "0" and "90" signals, whereas if the levels are opposite, the Phase Detector will generate an internal Decrement signal, to advance the generation of the "0" and "90" signals.

In some embodiments, the phase correction signals are low-pass filtered, using a Finite-Impulse-Response (FIR) filter, an Infinite-Impulse-Response (IIR) filter, or any other suitable filter. Such filters are not shown in the figures, for clarity.

As the sampled lanes contain data, which may not toggle in every clock transition, the internal Increment and Decrement signals are not generated in all clock transitions; however, in embodiments, data encoding assures that, whatever the original data is, there will always be sufficient transitions in the transmitted data to allow proper phase locking (e.g., by 64/66 encoding and/or by pseudo-random encoding).

The Increment/Decrement signals that Phase Detector 208 generates are input to Phase Shifter 210, which, in turn, increments or decrements the phase shift of the "0" and "90" signals relative to the phase of the Rx-Clock. For example, if the resolution of the generated phases is 22.5°, and the phase delays of the "0" and "90" outputs relative to the low-to-high transition of Rx-Clock are 135° and 225°, respectively, an Increment input will change the phase shifts to 157.5° and 247.5°; whereas a Decrement input will change the phase shifts to 112.5° and 202.5°.

S&H 206 also samples Lane A upon transitions in the "0" input, to generate the restored data output of CDR 116. The sampled output, designated "sample @ 0", is input to phase detector 208, and output from CDR 116 to further processing, such as deserialization and decoding.

Since Lane-A and Lane-B are matched in terms of delay variations and interference, the data and clock of Lane-B may be restored using the phase corrections that are extracted by CDR 116. Sampler 118, which is coupled to Lane B, comprises a Phase Shifter 212 and a Sample and Hold (S&H) circuit 214. The Phase Shifter is similar to Phase Shifter 210, except that Phase Shifter 212 does not generate the "90" output, and, hence, may be simpler and may consume less power (in some embodiments, the same circuit is used, but the "90" output is not connected, or connected to a dummy load).

Similarly, S&H 214 is like S&H 206, except that S&H 214 does not have a "90" input and does not sample the lane at transitions on a "90" input. Hence, S&H 214 may be simpler than S&H 206 (in some embodiments, the same circuit may be used, except that the "sample @90" output is not connected or connected to a dummy load).

In summary, when two (or more) lanes are similar in terms of interference, one lane may be coupled to a CDR circuit comprising an S&H, a phase-detector and a phase shifter, and configured to detect the phase and to increment or decrement the phase of a phase-shifter that controls the sampling phases. The other lane (or lanes) may be coupled to a Sampler, comprising a simpler S&H and a simpler Phase-Shifter, and configured to sample the data lane (or lanes) at the correct phase by keeping track of the phase corrections generated by the CDR. Thus, according to the example embodiment described in FIG. 2, the area and power consumption of circuits that restore clock and data from multiple matched lanes may be significantly reduced.

As would be appreciated, the structures of CDR 116 and Sampler 118 described above are cited by way of example. CDRs and Samplers in accordance with the disclosed techniques are not limited to the description hereinabove. For example, various suitable CDR architectures may be used, including over-sampling CDR, DLL-based CDR, PLL-based CDR, and others. In some embodiments, some or all the samplers do not comprise phase shifters and, instead, the "0" output of the CDR is input to the S&H units of the samplers, either directly or through suitable delay circuits.

Figure 3:
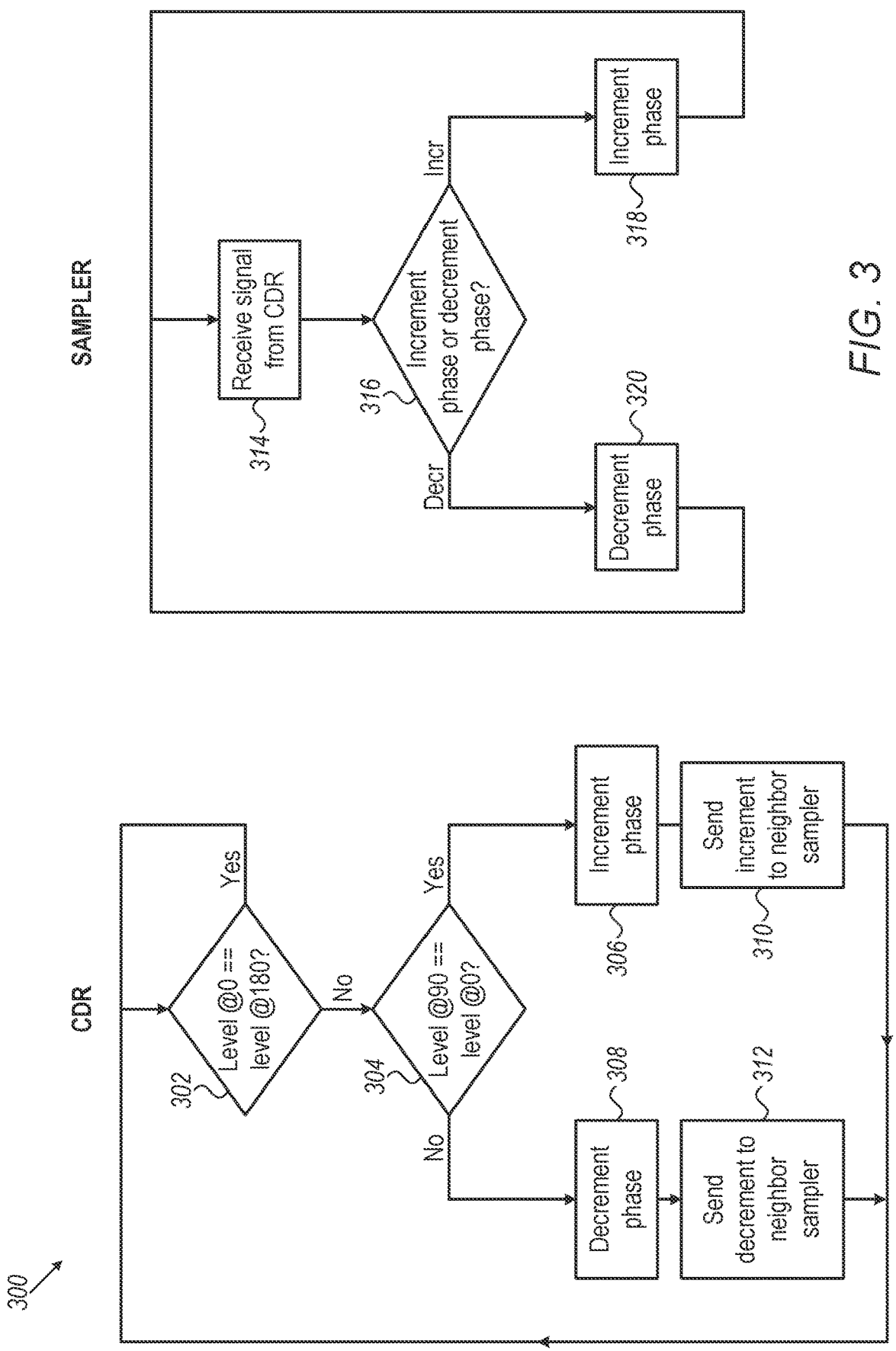
FIG. 3 is a flowchart that schematically illustrates a method for clock and data recovery in a CDR and in a neighboring sampler, in accordance with embodiments of the present invention.

FIG. 3 is a flowchart 300 that schematically illustrates a method for clock and data recovery in a CDR and in a neighboring sampler, in accordance with embodiments of the present invention. The flowchart is executed concurrently by a CDR 116 and a neighboring sampler 118 (FIG. 2).

The CDR first enters a Checking-Equal-Levels step 302, and checks if the signal levels of the lane at 0° and 180° are equal. Equal levels mean that there was no change in the bit level between the time when phase=0° and phase=180°. In this case, the phase cannot be estimated, and the CDR reenters step 302 (the CDR will re-enter step 302 at the next time when phase=0°).

If, in step 302, the levels of the signals are different, the CDR will enter a Comparing-90° step 304 and compare the signal level at 0° to the signal level at 90°. The CDR will then enter an Incrementing Phase step 306 if the levels are equal, or a Decrementing Phase step 308 if the levels are not equal (this technique, also called Bang-Bang, always corrects the phase in small increments, and, there is no steady state in which the CDR does not change the phase upon an edge in the data).

In step 306, the CDR increments the phase by a small value (e.g. 360°/32=11.25°), and then enters a Sending-Increment-to-Sampler step 310, sends an Increment Phase signal to neighboring samplers, and then re-enter step 302, for the next phase correction.

Similarly, in step 308, the CDR decrements the phase by a small value, and then sends a Decrement Phase signal to neighboring samplers in a Sending-Decrement-to-Sampler step 312, and, lastly, re-enters step 302, for the next phase correction.

The neighboring sampler starts at a Receiving-Signal step 314, wherein the sampler waits until the CDR sends an Increment or a Decrement phase signal. When the sampler receives a signal from the CDR, the sampler enters a Checking-Increment/Decrement step 316 and then proceeds to an Incrementing-Phase step 318. If the received signal is an Increment-Phase, or to a Decrementing-Phase step 320 if the signal is a Decrement-Phase.

In steps 318, 320 the sampler increments or decrements (respectively) the sampling phases, and then re-enters step 314.

Thus, according to the flowchart illustrated in FIG. 3, a CDR, when detecting a transition in a coupled data lane, samples the signal and then increments or decrements the sampling phases, according to the level of the signal at a 90° phase. Neighboring samplers receive the increment/decrement phase signals from the CDR and adjust the sampling phases of the corresponding lanes accordingly; saving power and area (compared to additional CDRs).

As would be appreciated, flowchart 300 described above is cited by way of example. Flowcharts in accordance with the disclosed techniques are not limited to the description hereinabove. For example, step 314 may be merged with step 316; step 306 may be merged with step 310 and step 308 may be merged with step 312.

While the power saving achieved in embodiments of the present invention is always desirable, area saving may come at a cost. First, two types of cells must be maintained (CDR cells and Sampler cells). Second, different cells are harder to match in terms of delay variations and induced noise. In some embodiments according to the present invention, a single circuit is used that is configurable to operate in one of two configurations: a CDR configuration ("master"), with full CDR functionality; and, a Sampler configuration ("slave"), wherein the circuit receives the phase correction signaling from a neighboring Master-configured circuit ("peer circuit") and samples the data accordingly. When in the Slave configuration, some of the CDR circuits may be degenerated, to save power.

Configuring of the CDR may be done by software, or may be defined by a strap or a mask option, for example.

Figure 4:
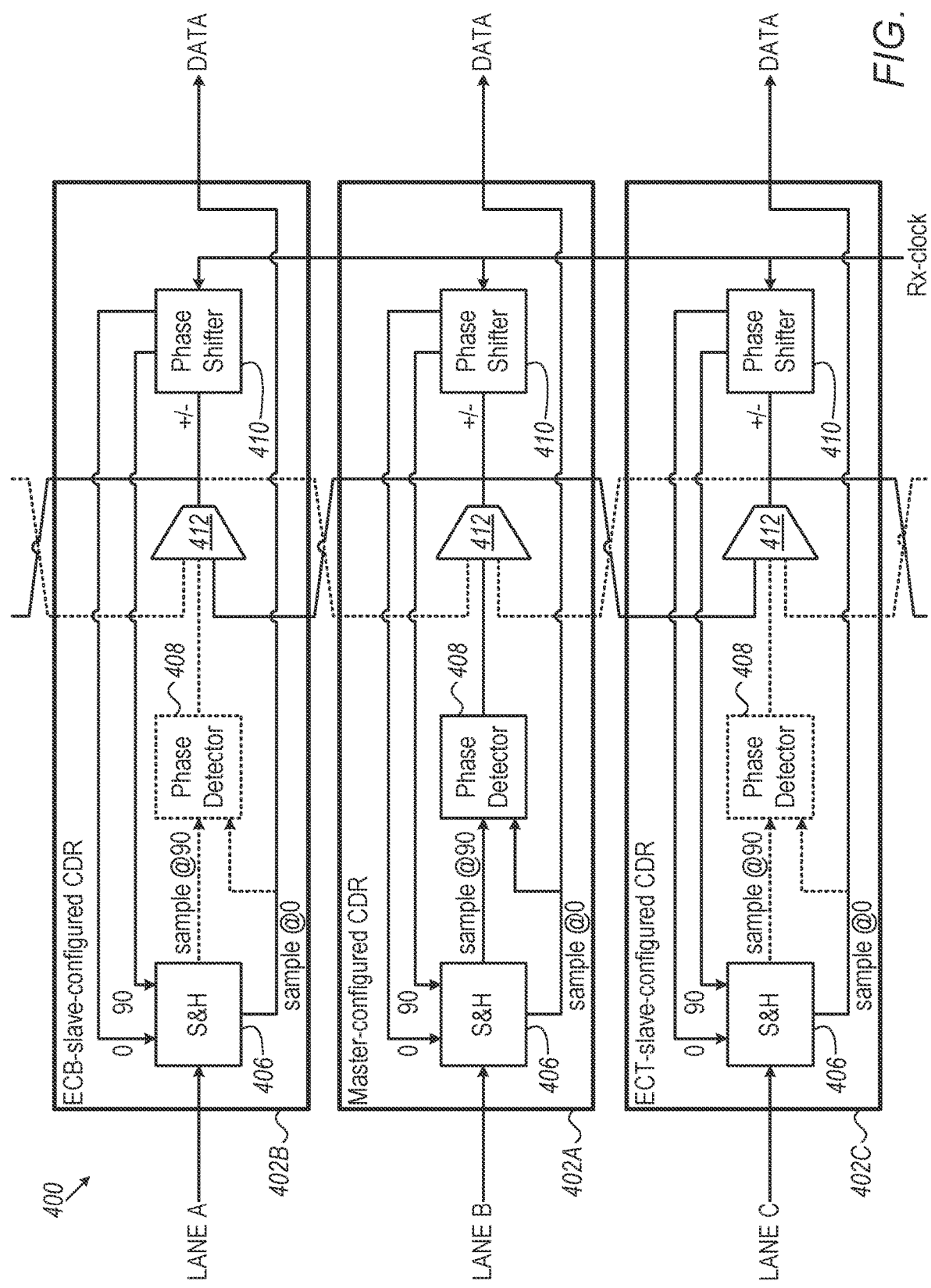
FIG. 4 is a block diagram that schematically illustrates power-saving clock and data restoration using identical CDR units, in accordance with embodiments of the present invention.

FIG. 4 is a block diagram that schematically illustrates power-saving clock and data restoration using identical CDR units, in accordance with embodiments of the present invention. Three identical CDR circuits with different configurations are shown: a master-configured CDR 402A that is coupled to Lane B; an Externally-Controlled-from-Bottom (ECB) Slave-configured CDR 402B that is coupled to Lane A; and, an Externally-Controlled-from-Top (ECT) Slave-configured CDR 402C, that is coupled to Lane C. The three CDRs are located next to each other, and further CDRs which may be added will be placed on top of CDR 402B or below CDR 402C. CDRs which are located next to each other will be referred to as Neighboring CDRs.

The three CDR circuits are identical and hence well matched in terms of delay variations and noise. Each CDR comprises an S&H 406, a Phase Detector 408, a phase shifter 410 and a three-way multiplexor 412.

S&H 406 is like S&H 214 (FIG. 2), but the 90° sampling is disabled in the slave configurations (and the corresponding power is saved). Phase Detector 408 is like Phase Detector 208 (FIG. 2), except that in the slave configurations the phase detector is disabled. Multiplexor 412 transfers a top input, a center input or a bottom input, to Phase Shifter 410, which may be identical to Phase-shifter 210 (FIG. 2).

The functionality of the sub-units of CDRs 402A, 402B, 402C is summarized in the following table:

| | Master configured | ECB-slave configured | ECT-slave configured |
|---|---|---|---|
| S&H | Full | sample@90 disabled | sample@90 disabled |
| Phase Detector | Full | bypass | bypass |
| Multiplexor | Select center input | Select bottom input | Select top input |
| Phase Shifter | Full | Partial (for the "0" phase only) | Partial (for the "0" phase only) |

The multiplexing scheme allows addition of more slave units above and below the illustrated CDR units. All units added above CDR 402B will be ECB-slave configured, and all units added below CDR 402C will be ECT-slave configured.

As would be appreciated, the vertical-tiles geometry of the CDR cells may be used when the cells are aligned along a vertical edge of the DCIC. In alternative embodiments, horizontal tiles may be used, and the terms "bottom" and "top" replaced by "left" and "right.

As mentioned above, the configuration of the CDR units may be done by software, by strapping inputs, by mask options or by any other suitable technique.

Thus, according to the configuration illustrated in FIG. 4, identical CDR units may be used to restore clock and data from neighboring lanes; the matching between the units allows high data rate USR communication, and, by propagating the phase control signals from a single master-configured CDR to multiple slave-configured CDRs, considerable power may be saved.

As would be appreciated, the configuration of CDRs 402A, 402B and 402C described above is cited by way of example. CDRs in accordance with the disclosed techniques are not limited to the description hereinabove. For example, in some embodiments, the accumulated delay through the multiplexors from a master-configured CDR to a remote slave-configured CDR may be compensated by advancing the Rx-clock or by delaying the lane of the remote CDR. In some embodiments, Multiplexor 412 is not implemented; instead, in a Master-configured CDR the phase detector output will be routed to the Phase-Shifter input; and in ECB- and ETB-configured, inputs from a bottom-input or a top-input (respectively) will be wired to the Phase Shifter.

Setting the Initial Phases

The disclosed techniques typically involve obtaining initial phase settings for the samplers, and then, assuming that the changes in the phase are similar for neighboring lanes, tracking the changes from neighbor lanes that comprise CDRs. Methods to obtain the initial phase settings are known in the art, and not described in the example embodiments hereinabove. For example, a transmitter may initially or periodically send a "training sequence" comprising a known sequence (e.g., of alternating 1s and 0s); the sampler then may change the phase setting until the training sequence is received with no errors. In another example, the sampler adjusts the initial phase by minimizing CRC errors detected in the received stream.

In some of the embodiments described above, all lanes are identical, and, in the lanes where only a sampler is used, the CDR is turned off to save power. In some embodiments, the CDR may, however, turn on initially or periodically to determine the initial phase, and then turn off. Determination of the initial phase may be triggered, for example, upon power-up, upon reset, or upon a signal that is generated by software or hardware circuitry, e.g., periodically.

The method of FIG. 3, the configuration of CDR 116, Sampler 118, and configurable CDR 402, and all subunits thereof, are example method and configurations that are shown purely for the sake of conceptual clarity. Any other suitable methods and configurations can be used in alternative embodiments.

In various embodiments, CDR 116, Sampler 118, and configurable CDR 402 may be implemented using suitable hardware, such as one or more Application-Specific Integrated Circuits (ASIC) or Field-Programmable Gate Arrays (FPGA), or a combination of ASIC and FPGA.

Although the embodiments described herein mainly address USR communication in MCMs, the methods and systems described herein can also be used in other applications.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A Multi-Chip-Module (MCM), comprising:
an MCM substrate; and
at least a data producing IC (DPIC) and a data-consuming IC (DCIC), both mounted on the MCM substrate and connected to one another through a high-speed bus comprising at least first and second embedded-clock data lanes;
wherein the DCIC comprises:
a data recovery circuit that is configured to restore data from the first data lane, and to generate from the first data lane correction signaling comprising at least (i) a phase-decrement signal when a sampling phase of the first data lane is to be decremented and (ii) a phase-increment signal when the sampling phase of the first data lane is to be incremented; and
a data sampler that is configured to restore the data from the second data lane by sampling the second data lane at a phase responsive to the correction signaling generated from the first data lane, including (i) decrementing a sampling phase of the second lane when the correction signaling comprises the phase-decrement signal and (ii) incrementing the sampling phase of the second lane when the correction signaling comprises the phase-increment signal.

2. The MCM according to claim 1, wherein the data sampler comprises a phase-shifter and a sample-and-hold, the phase-shifter configured, in response to the correction signaling, to send phase signaling to the sample-and-hold, and the sample-and-hold configured to sample the second data lane in response to the phase signaling.

3. The MCM according to claim 1, wherein the data recovery circuit and the sampler comprise respective first and second instances of a circuit that is configurable to operate in first and second configurations, wherein:
in the first configuration, the circuit is configured to restore the data and generate the correction signaling from a data lane, and
in the second configuration, the circuit is configured to receive the correction signaling from a peer circuit and to restore the data from the data lane based on the correction signaling received from the peer circuit.

4. The MCM according to claim 3, wherein, in the second configuration, the circuit is further configured to transfer the control signaling to an additional peer circuit.

5. The MCM according to claim 3, wherein the circuit comprises correction signaling generation circuitry that is enabled in the first configuration and disabled in the second configuration.

6. The MCM according to claim 3, wherein the circuit is configured to acquire an initial clock phase of the data lane in the first configuration, and then to switch to the second configuration and track clock-phase variations, relative to the peer circuit, based on the received correction signaling.

7. A method in a Multi-Chip-Module (MCM), the method comprising:
communicating in the MCM between a data producing IC (DPIC) and a data-consuming IC (DCIC), both mounted on the MCM substrate and connected to one another through a high-speed bus comprising at least first and second embedded-clock data lanes;
using a data recovery circuit in the DCIC, restoring data from the first data lane, and generating from the first data lane correction signaling comprising at least (i) a phase-decrement signal when a sampling phase of the first data lane is to be decremented and (ii) a phase-increment signal when the sampling phase of the first data lane is to be incremented; and
restoring the data from the second data lane in the DCIC using a data sampler, by sampling the second data lane at a phase responsive to the correction signaling generated from the first data lane, including (i) decrementing a sampling phase of the second lane when the correction signaling comprises the phase-decrement signal and (ii) incrementing the sampling phase of the second lane when the correction signaling comprises the phase-increment signal.

8. The method according to claim 7, wherein the data sampler comprises a phase-shifter and a sample-and-hold, and wherein sampling the second data lane comprises sending phase signaling from the phase-shifter to the sample-and-hold in response to the phase correction signaling, and sampling the second data lane by the sample-and-hold in response to the phase signaling.

9. The method according to claim 7, wherein the data recovery circuit and the sampler comprise respective first and second instances of a circuit that is configurable to operate in first and second configurations, and wherein restoring the data and the clock comprises:
in the first configuration, restoring the data and generating the correction signaling from a data lane by the circuit, and
in the second configuration, receiving the correction signaling from a peer circuit and restoring the data from the data lane based on the correction signaling received from the peer circuit.

10. The method according to claim 9, further comprising, in the second configuration, transferring the control signaling from the circuit to an additional peer circuit.

11. The method according to claim 9, wherein the circuit comprises correction signaling generation circuitry that is enabled in the first configuration and disabled in the second configuration.

12. The method according to claim 9, and comprising acquiring in the circuit an initial clock phase of the data lane in the first configuration, and then switching to the second configuration and tracking clock-phase variations, relative to the peer circuit, based on the received phase correction signaling.

* * * * *